United States Patent [19]
Hiraga

[11] Patent Number: 6,091,089
[45] Date of Patent: Jul. 18, 2000

[54] SEMICONDUCTOR INTEGRATED CIRCUIT DEVICE

[75] Inventor: Noriaki Hiraga, Kyoto, Japan

[73] Assignee: Rohm Co., Ltd., Kyoto, Japan

[21] Appl. No.: 09/175,537

[22] Filed: Oct. 20, 1998

[30] Foreign Application Priority Data

Oct. 20, 1997 [JP] Japan ................................ 9-286404

[51] Int. Cl.[7] .................................................. H01L 23/48
[52] U.S. Cl. ...................... 257/203; 257/203; 257/207; 257/210; 257/484; 257/786
[58] Field of Search .................................. 257/203, 207, 257/210, 784, 786

[56] References Cited

U.S. PATENT DOCUMENTS

| | | | |
|---|---|---|---|
| 5,592,026 | 1/1997 | Frisina et al. ............................ | 257/786 |
| 5,646,451 | 7/1997 | Freyman et al. ........................ | 257/784 |
| 5,684,332 | 11/1997 | Chen et al. .............................. | 257/786 |
| 5,773,889 | 6/1998 | Love et al. ............................... | 257/737 |
| 5,783,868 | 7/1998 | Galloway ................................ | 257/784 |
| 5,798,571 | 8/1998 | Nakajima ................................ | 257/784 |
| 5,814,892 | 9/1998 | Steidl et al. ............................. | 257/784 |
| 5,883,427 | 3/1999 | Arimoto .................................. | 257/690 |
| 5,886,393 | 3/1999 | Merrill et al. ........................... | 257/531 |
| 5,892,283 | 4/1999 | Baldwin et al. ........................ | 257/758 |

FOREIGN PATENT DOCUMENTS

| | | | |
|---|---|---|---|
| 404144156 | 5/1992 | Japan ..................................... | 257/784 |
| 406069403 | 3/1994 | Japan ..................................... | 257/784 |
| 406084991 | 3/1994 | Japan ..................................... | 257/784 |
| 406177312 | 6/1994 | Japan ..................................... | 257/784 |

*Primary Examiner*—David Hardy
*Assistant Examiner*—Edgardo Ortiz
*Attorney, Agent, or Firm*—Arent Fox Kintner Plotkin & Kahn, PLLC

[57] ABSTRACT

A semiconductor integrated circuit device has a semiconductor chip, on which are formed a plurality of input/output circuits and input/output pads individually connected electrically thereto. The input/output pads are connected electrically to a plurality of inner leads formed on the frame on which the semiconductor chip is mounted. The input/output circuits are arranged in two rows along each edge of the semiconductor chip, with the first row of input/output circuits arranged closer to the edge than the second row of input/output circuits. The input/output pads connected to the first-row input/output circuits are arranged in two rows in such a way that the first and second rows of input/output pads sandwich the first row of input/output circuits. The input/output pads connected to the second-row input/output circuits are arranged to form a third row of input/output pads along the second row of input/output circuits.

8 Claims, 4 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and more particularly to a semiconductor integrated circuit device in which the input/output pads of a semiconductor chip and the inner leads of the frame on which the semiconductor chip is mounted are connected electrically by wire bonding or the like.

2. Description of the Prior Art

A typical semiconductor chip has a plurality of input/output pads formed along its edges. In a semiconductor integrated circuit device, those input/output pads and the inner leads of the frame on which the semiconductor chip is mounted are connected electrically, for example, by wire bonding, and this enables the semiconductor chip to communicate electrically with circuits and components arranged outside the package of the semiconductor integrated circuit device.

As shown in FIG. 5, in some conventional semiconductor chips, input/output circuits 42 are arranged in a row along each edge of the semiconductor chip 1, and input/output pads 43 and 44 are arranged in two rows in such a way that the two rows of input/output pads 43 and 44 sandwich the row of input/output circuits 42 and that the input/output pads 43 and 44 are arranged at regular intervals within each row. This type of pad arrangement is referred to as the "staggered" arrangement in the present specification.

As shown in FIG. 9, the semiconductor chip 1 is mounted, by die bonding or the like, on a stage 21 formed on a frame 24. The stage 21 is formed as an island that is supported by support bars 22 at its corners. In each of those areas of the frame 24 which exist between two adjacent support bars 22, a number of inner leads 23 are arranged so as to extend radially.

In this way, for each edge of the semiconductor chip 1, the inner leads 23 are arranged in an area wider than the area in which the input/output pads are arranged. The input/output pads and the inner leads 23 are connected by way of wires 3 (only partially shown in the figure) that are, for example, wire-bonded thereto.

As shown in FIG. 6, in cases where the input/output pads and the inner leads 23 are connected by wire bonding, to prevent contact between a wire 3f coming from a pad 43 arranged in a chip-center-side (inner) row and a wire 3g coming from a pad 44 arranged in a chip-edge-side (outer) row, the wires are arranged in two, i.e. an upper and a lower, layers. This is the reason that, in the plan view shown in FIG. 9, some wires from pads in an inner row appear to intersect wires from pads in an outer row as indicated at 60, but actually this is not the case.

In other conventional semiconductor chips, input/output pads 45 are arranged in one row along each edge of the semiconductor chip 1. In this type of semiconductor chip 1, the input/output pads 45 are connected to input/output circuits 42 by way of a fan-like pattern of metal conductors 51 extending from the input/output circuit 42. In addition, as shown in FIG. 8, the wires 3h connecting the input/output pads 45 to inner leads 23 are arranged in one layer. Accordingly, in this case, apparent intersection between wires as observed at 60 in FIG. 9 never occurs. Note that, in FIGS. 5 and 7, reference numeral 50 represents conductor layers that are laid over the input/output circuits 42 so as to serve as power-source and ground conductors.

In the former "staggered" arrangement (see FIG. 5), the number of input/output pads 43 and 44 that are arranged in each row depends on the number of input/output circuits 42 arranged along each edge of a semiconductor chip. This imposes a limit to the number of pads that can be arranged along one edge. That is, although it is technically possible to arrange a larger number of pads, the maximum number of pads that can actually be arranged on a semiconductor chip of a given chip size depends on the number of input/output circuits (drivers) that can be arranged therein. This limit is referred to as the "driver limit".

On the other hand, in the latter "one-row" arrangement in which the input/output pads are arranged in one row (see FIG. 7), the current wire bonding technique requires that the interval s between two adjacent pads 45 be greater than the width t of each input/output circuit 42. This means that, as long as the pads 45 are arranged in one row, the size of the entire semiconductor chip 1 depends on the total number of pads 45 that are arranged thereon and the interval s. This imposes a limit to the maximum number of pads that can be arranged on a semiconductor chip of a given chip size, and this limit is referred to as the "pad limit".

In keeping with the progress of integrated circuit technology, and owing to other factors, semiconductor chip manufacturers have been making every effort to arrange more and more input/output pads on smaller and smaller chips. However, in conventional semiconductor integrated circuit devices, it has been inevitable that the number of pads that can be arranged on a semiconductor chip of a given chip size is inconveniently limited by the "driver limit" when the "staggered" arrangement is adopted, and by the "pad limit" when the "one-row" arrangement is adopted.

SUMMARY OF THE INVENTION

An object of the present invention is to provide a semiconductor integrated circuit device in which a larger number of input/output pads than ever can be arranged in a semiconductor chip of a given chip size without being affected by a driver- or pad-associated limit.

To achieve the above object, according to one aspect of the present invention, in a semiconductor integrated circuit device that has a semiconductor chip having a plurality of input/output circuits and input/output pads individually connected electrically thereto, that has a frame on which the semiconductor chip is mounted, and in which the input/output pads of the semiconductor chip and a plurality of inner leads formed on the frame are connected electrically, the input/output circuits are arranged in two rows along each edge of the semiconductor chip, the input/output pads connected to the input/output circuits arranged in the chip-edge-side row are arranged in a staggered arrangement, and the input/output pads connected to the input/output circuits arranged in the chip-center-side row are arranged in a single row or in two or more rows.

In this layout, arranging the input/output circuits in two rows along each edge of the semiconductor chip helps eliminate the "driver limit". In addition, arranging the chip-edge-side input/output circuits in an staggered arrangement helps eliminate the "pad limit". Thus, this layout helps increase the total number of pads that can be arranged on a semiconductor chip of a given chip size.

According to another aspect of the present invention, in the layout described above, spaces are secured between adjacent ones of the chip-center-side input/output circuits, between adjacent ones of the input/output pads connected to the chip-center-side input/output circuits, and between adjacent ones of the input/output pads connected to the chip-edge-side input/output circuits. These spaces serve as channels (i.e. spaces through which wires are arranged) through which connection between the chip-edge-side input/output circuits and the circuit elements formed in a central portion of the semiconductor chip is achieved. Thus, this layout helps secure channels for connecting the chip-edge-side input/output circuits to the circuit elements formed in a central portion of the semiconductor chip.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1A:
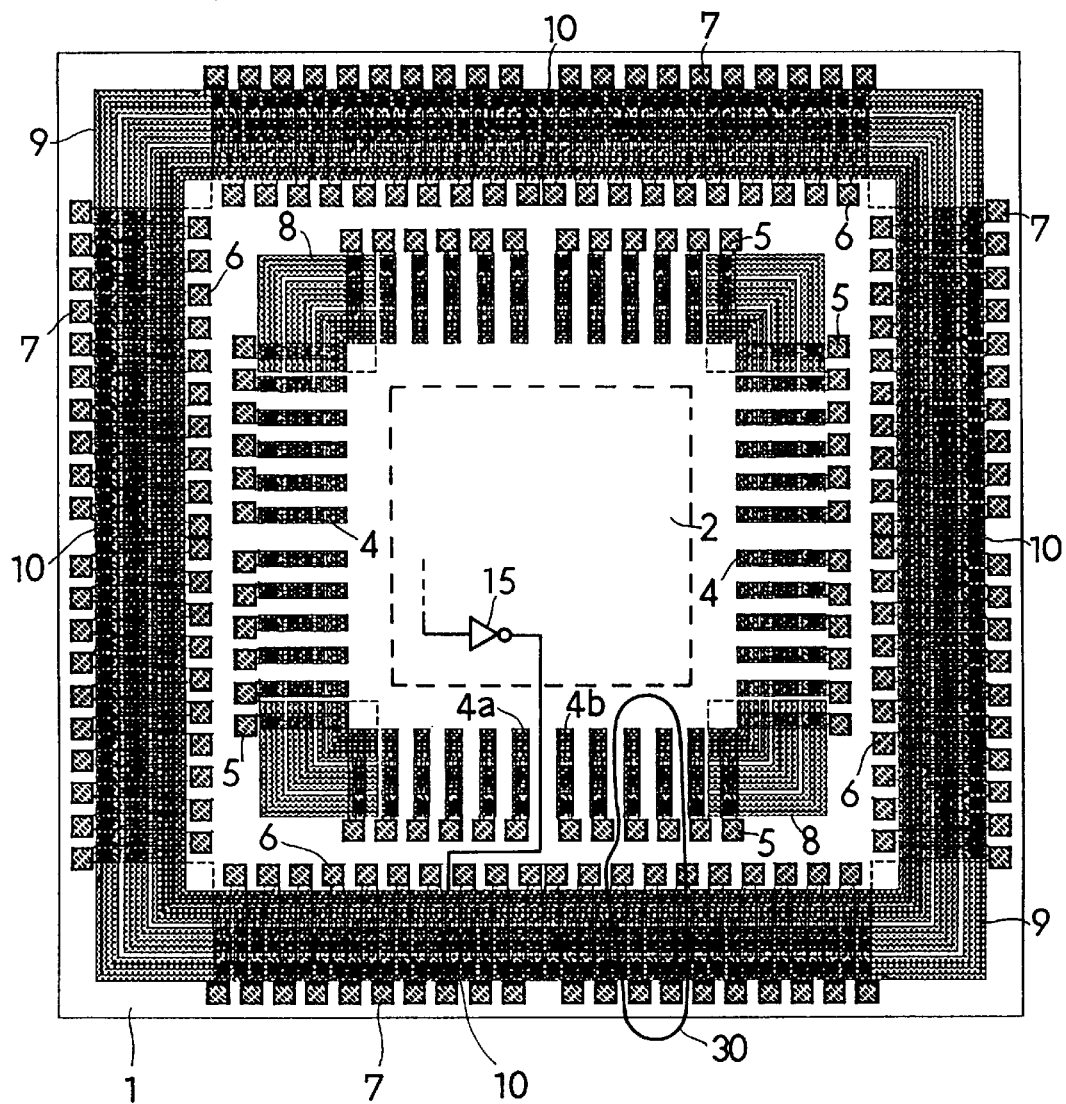
FIG. 1A is a plan view of a relevant portion of the semiconductor chip employed in a semiconductor integrated circuit device embodying the present invention.
Figure 9:
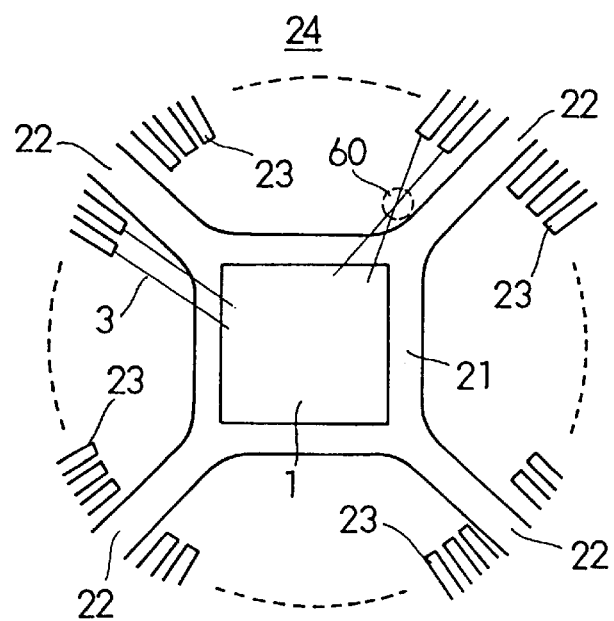
FIG. 9 is a diagram illustrating how the inner leads are arranged radially on the frame.

Hereinafter, an embodiment of the present invention will be described with reference to the drawings. FIG. 1A is a plan view illustrating how input/output circuits and input/output pads are arranged on a semiconductor chip in a semiconductor integrated circuit device embodying the present invention. This semiconductor chip 1 has logic circuits 2 formed in its central portion, and communicates data by way of input/output circuits 4 and 10 and input/output pads 5, 6, and 7. Just as in the conventional semiconductor integrated circuit device shown in FIG. 9, the semiconductor chip 1 is mounted, by die bonding or the like, on a stage 21 formed on a frame 24, and inner leads 23 are so arranged as to extend radially.

Figure 1B:
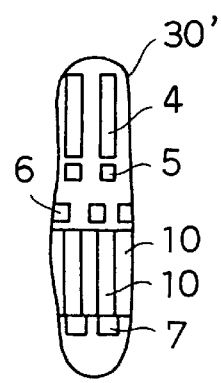
FIG. 1B is a diagram illustrating a portion of FIG. 1A.

As shown in FIG. 1A, along and near each edge of the semiconductor chip 1, the input/output circuits 10 are arranged as close as possible to one another, and the input/output pads 6 and 7 are arranged in a staggered arrangement on both sides of the row of the input/output circuits 10. In addition, the input/output circuits 4 and the input/output pads 5 are arranged nearer to the center of the semiconductor chip 1 than the input/output circuits 10. The input/output circuits 4 are arranged with a predetermined space between one another, and so are the input/output pads 5. The input/output pads 5 connected to the input/output circuits 4 are arranged in a single row. The layout in a portion 30 of FIG. 1A is illustrated in more detail at 30' in FIG. 1B. Note that, in FIG. 1B, the pattern of conductor layers is omitted.

In this way, along each edge of the semiconductor chip 1, the input/output circuits 4 and 10 are arranged in two rows, and the input/output pads 5, 6, and 7 are arranged in three rows. Note that the input/output circuits are each composed of a plurality of transistors and other circuit elements, and serve mainly to stabilize the signals to be output via the pads and sometimes to process in a predetermined manner the signals received via the pads.

Figure 2:
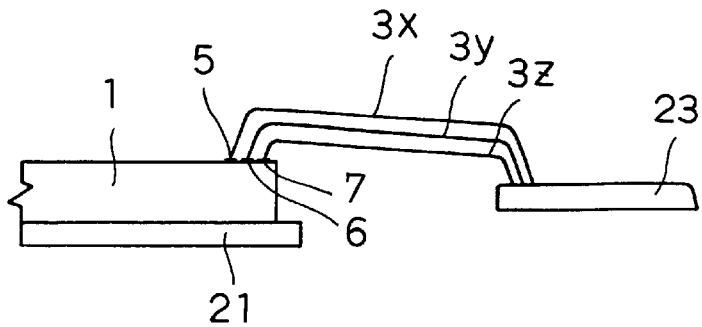
FIG. 2 is a side view of a relevant portion of the semiconductor integrated circuit device of the embodiment, illustrating an example of how wire bonding is performed.

As shown in FIG. 2, to connect these input/output pads 5, 6, and 7 to the radially arranged inner leads 23 by wire bonding, the wires 3x, 3y, and 3z need to be arranged in three layers. Accordingly, if seen in a plan view, some wires from pads in different rows appear to intersect one another as indicated at 50 in FIG. 9, but actually the wires 3x, 3y, and 3z never intersect one another.

However, such three-layer arrangement of wires makes the package of the semiconductor integrated circuit device unduly thick. Since a semiconductor integrated circuit device for use in a small-size appliance such as a portable telephone is required to have as thin a package as possible, in the embodiment under discussion, the thickness of the package is minimized in the following manner.

Figure 3:
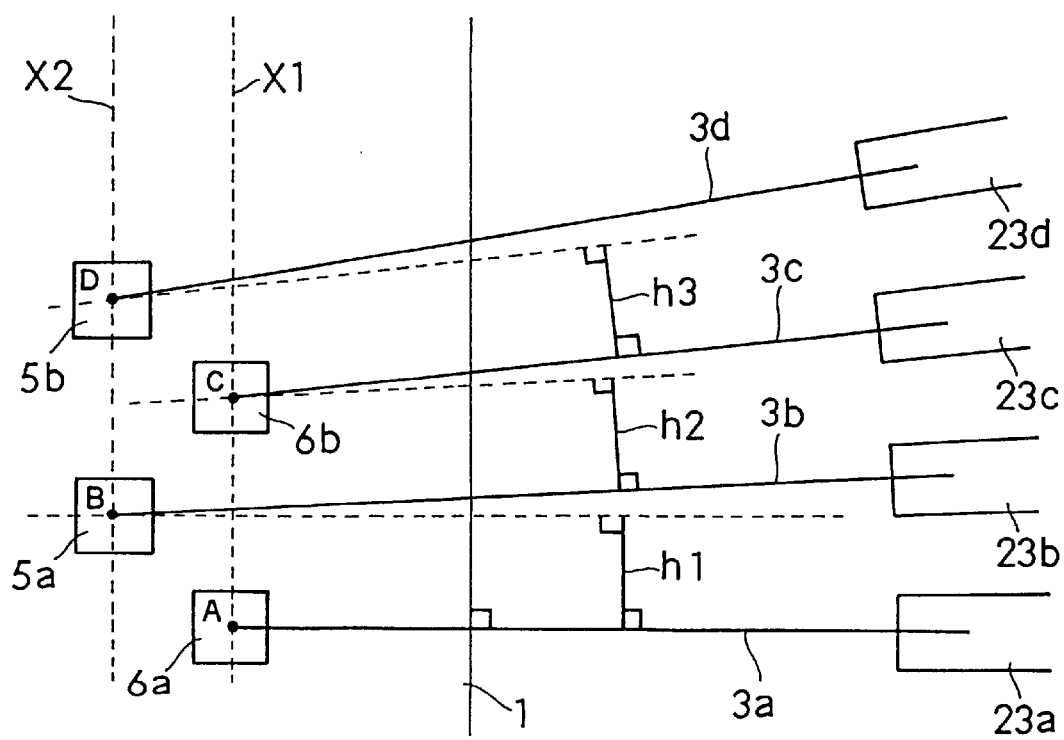
FIG. 3 is an enlarged plan view of a relevant portion of the semiconductor integrated circuit device of the embodiment, illustrating another example of how wire bonding is performed.
Figure 4:
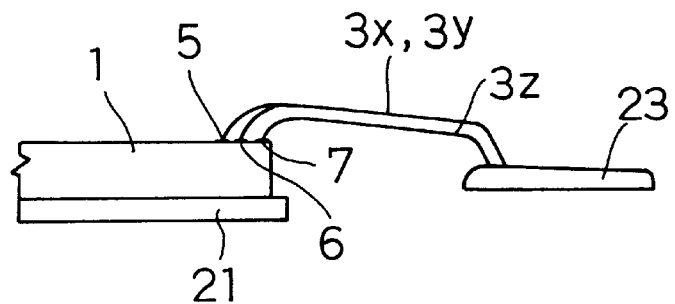
FIG. 4 is a side view corresponding to the plan view shown in FIG. 3.
Figure 5:
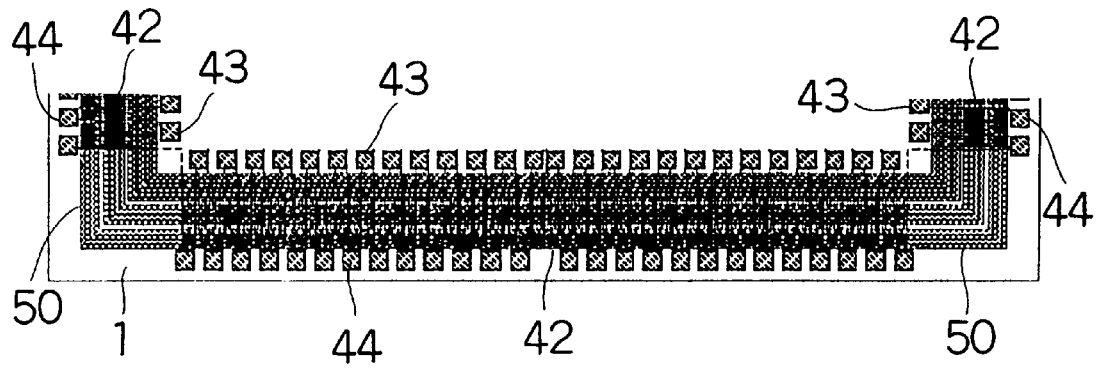
FIG. 5 is a plan view of a relevant portion of a conventional semiconductor integrated circuit device in which pads are arranged in a staggered arrangement.
Figure 6:
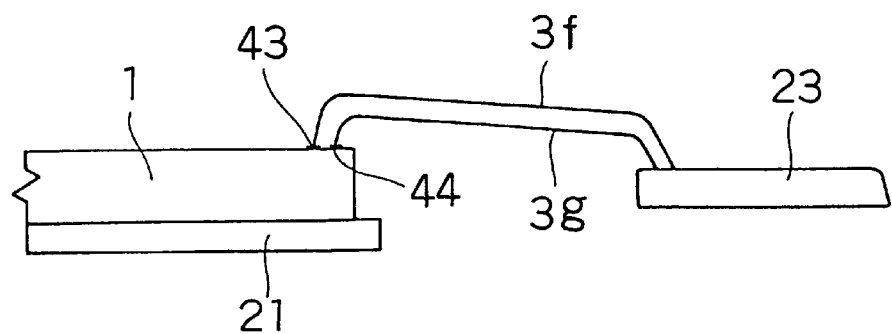
FIG. 6 is a side view of a relevant portion of the conventional semiconductor integrated circuit device shown in FIG. 5.

As shown in FIG. 4, for the input/output pads 6 and 7 that are arranged in a staggered arrangement, the wires 3y and 3z are arranged in two layers just in the manner as described previously. On the other hand, for the input/output pads 5 that are arranged in the innermost row, for example in the manner as shown in FIG. 3 and as will be described below, the input/output pads 5 and 6 are arranged in such positions that allow the wires 3x and 3y to be arranged alternately with the wires 3x extending further inward than the wires 3y. This makes it possible to arrange the wires 3x and 3y in one layer.

FIG. 3 shows an enlarged view of a part of one edge of the semiconductor chip 1 shown in FIG. 1A. Now, with reference to this figure, how the positions to arrange the input/output pads 5 and 6 in are determined will be described. Note that, in FIG. 3, such elements as are not relevant to the description here, e.g. the input/output pads 7 and the input/output circuits 4 (see FIG. 1A), are omitted.

First, the input/output pad 6a that is connected to the inner lead 23a (which is that one among the inner leads 23 arranged between two given adjacent support bars which comes substantially on the center line of the corresponding edge of the semiconductor chip) is so positioned that the center of the pad 6a falls on a point A that lies on the outer row X1 and where the wire angle substantially equals to 90°.

Next, the input/output pad 5a that is connected to the inner lead 23b (which is adjacent to, and closer to a corner of the semiconductor chip than, the inner lead 23a) is so positioned that the center of the pad 5a falls on a point B that lies on the inner row X2 and where the normal h1 to the wire 3a connecting the pad 6a to the inner lead 23a has a predetermined length.

Next, the input/output pad 6b that is connected to the inner lead 23c (which is adjacent to, and closer to the corner of the semiconductor chip than, the inner lead 23b) is so positioned that the center of the pad 6b falls on a point C that lies on the outer row X1 and where the normal h2 to the wire 3b connecting the pad 5a to the inner lead 23b has a predetermined length.

In this way, once the position of the input/output pad that is connected to a given inner lead is determined, the position of the input/output pad that is connected to the inner lead adjacent to, and closer to a corner of the semiconductor chip than, that inner lead is automatically determined. Thus, the position of the input/output pad that is connected to the inner lead closest to the support bar 22 (see FIG. 9) at that corner is determined last. For the remaining half of this edge and for the other edges, the positions of the pads are determined in the same manner.

This method makes it possible to arrange the input/output pads as close as possible to one another but not so close as to make wire bonding difficult. In addition, this method helps prevent intersection among the wires 3x and 3y from the pads 6 and 7 even in cases where a typical frame having radially arranged inner leads is used. Thus, this method permits the wires 3x, 3y and 3z to be arranged in two layers, and thus helps reduce the thickness of the package.

In FIG. 1A, the chip-center-side input/output circuits 4 are arranged at a predetermined distance from, and with a predetermined space between, one another, and so are the chip-center-side input/output pads 5. The reason is as follows. For example, as shown in FIG. 1A, connection between a NOT gate 15 included in the logic circuits 2 to one of the chip-edge-side input/output circuits 10 is achieved through the space between the input/output circuits 4a and 4b and then through the pads 5 and 6.

In other words, the spaces secured between the input/output circuits 4 and between the input/output pads 5, and the space secured between the input/output pads 5 and 6, serve as channels for connecting circuit elements such as the NOT gate 15 to transistors included in the chip-edge-side input/output circuits 10. Note that, although the power-source and ground conductor layers 8 that are laid over the chip-center-side input/output circuits 4 are only partially shown in FIG. 1A, actually they cover the entire area over those input/output circuits 4, just as the conductor layers 9 that are laid over the chip-edge-side input/output circuits 10.

As described above, in the embodiment under discussion, the staggered arrangement of the input/output pads 6 and 7 for the chip-edge-side input/output circuits 10 helps eliminate the "pad limit" described earlier. In addition, the two-row arrangement of the input/output circuits 4 and 10 helps eliminate also the "driver limit" described earlier.

Figure 7:
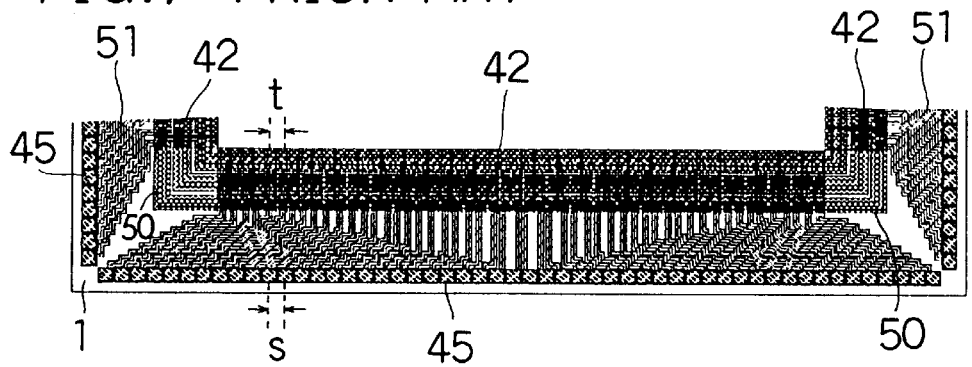
FIG. 7 is a plan view of a relevant portion of another conventional semiconductor integrated circuit device in which pads are arranged in a single row.
Figure 8:
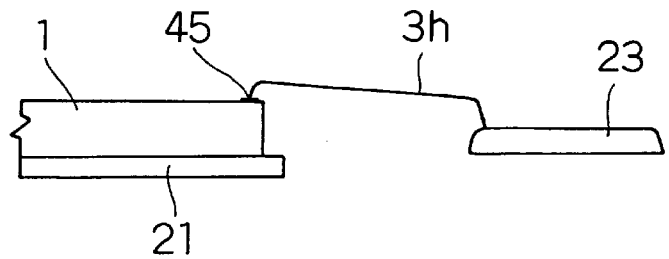
FIG. 8 is a side view of a relevant portion of the conventional semiconductor integrated circuit device shown in FIG. 7.

As a result, assuming that the "pad pitch" refers to the value obtained by dividing the size of a chip by the number of pads that can be arranged therein, the semiconductor chip of the embodiment under discussion requires only 70% of the pad pitch that is required in the conventional semiconductor chip (FIG. 7) in which the input/output pads are arranged in one row. That is, this embodiment allows a larger number of input/output pads to be arranged in a semiconductor chip of a given chip size.

On the other hand, according to this embodiment, exactly because the input/output circuits 4 and 10 are arranged in two rows, there is left an accordingly smaller area for the logic circuits 2. Thus, this embodiment is unfit for a large-scale circuit having a large number of gates, but is effective in producing a medium- or small-scale circuit that requires a large number of pads on as small a semiconductor chip as possible. This in turn produces many advantages including a reduced production cost of the semiconductor integrated circuit device.

As long as the wires 3x, 3y, and 3z are arranged in three or two layers as shown in FIG. 2 or 4, there remains a possibility that a wire will make contact with another. To prevent this, it is possible to use insulator-coated wires for wire bonding. This makes it possible to ensure electrical insulation even when a wire has come into contact with another, and thus helps enhance the reliability of the semiconductor integrated circuit device.

It is also possible to arrange the input/output pads 5 in a staggered arrangement in such a way that they are arranged in two rows that sandwich the chip-center-side input/output circuits 4 (see FIG. 1A) and thus in such a way that the entire input/output pads are arranged in four rows in total, or alternatively even in more rows. The inner leads do not necessarily have to be arranged radially; for example, they may be arranged parallel to one another in such a way that all of them are perpendicular to an edge of the semiconductor chip and that the wire angle equals to 90° anywhere. This, however, makes the intervals between the wires too narrow, and thus makes wire bonding difficult.

In the embodiment under discussion, the input/output pads are connected to the inner leads by wire bonding. However, the present invention is applicable also to semiconductor integrated circuit devices adopting a bump-based wiring method such as TAB (tape automated bonding), BGA (ball grid array), or CSP (chip size package), or even to printed circuit boards adopting flip-chip mounting.

What is claimed is:

1. A semiconductor integrated circuit device comprising:
   input/output circuits arranged to form a first and a second row of input/output circuits along each edge of a semiconductor chip;
   input/output pads connected to the input/output circuits of the first row and arranged to form a first and a second row of input/output pads in such a way that the first and second rows of input/output pads sandwich the first row of input/output circuits; and
   input/output pads connected to the input/output circuits of the second row and arranged to form a third row of input/output pads along the second row of input/output circuits.

2. A semiconductor integrated circuit device as claimed in claim 1,
   wherein the input/output circuits of the first row are formed closer to the edge of the semiconductor chip than the input/output circuits of the second row.

3. A semiconductor integrated circuit device as claimed in claim 2,
   wherein the input/output pads of the first row are arranged closer to the edge of the semiconductor chip than the input/output pads of the second row.

4. A semiconductor integrated circuit device as claimed in claim 3,
   wherein spaces are secured between adjacent input/output circuits of the second row, between adjacent input/output pads of the third row, and between adjacent input/output pads of the second row, so that wires connecting the input/output circuits of the first row to logic circuit elements formed in a central portion of the semiconductor chip will be so arranged as to pass through those spaces.

5. A semiconductor integrated circuit device comprising:
   input/output circuits arranged to form a first and a second row of input/output circuits along each edge of a semiconductor chip;
   input/output pads connected to the input/output circuits of the first row and arranged to form a first and a second row of input/output pads in such a way that the first and second rows of input/output pads sandwich the first row of input/output circuits;

input/output pads connected to the input/output circuits of the second row and arranged to form a third row of input/output pads along the second row of input/output circuits; and a frame that constitutes the semiconductor chip, wherein the input/output pads of the first, second, and third rows and inner leads formed on the frame are connected by way of wires.

6. A semiconductor integrated circuit device as claimed in claim 5, wherein the input/output circuits of the first row are formed closer to the edge of the semiconductor chip than the input/output circuits of the second row.

7. A semiconductor integrated circuit device as claimed in claim 6, wherein the input/output pads of the first row are arranged closer to the edge of the semiconductor chip than the input/output pads of the second row.

8. A semiconductor integrated circuit device as claimed in claim 7, wherein spaces are secured between adjacent input/output circuits of the second row, between adjacent input/output pads of the third row, and between adjacent input/output pads of the second row, so that wires connecting the input/output circuits of the first row to logic circuit elements formed in a central portion of the semiconductor chip will be so arranged as to pass through those spaces.

* * * * *